United States Patent [19]

Fukuda

[11] Patent Number: 4,871,416

[45] Date of Patent: Oct. 3, 1989

[54] METHOD AND DEVICE FOR CLEANING SUBSTRATES

[75] Inventor: Hisashi Fukuda, Tokyo, Japan

[73] Assignee: Oki Electric Industry Co., Ltd., Tokyo, Japan

[21] Appl. No.: 271,307

[22] Filed: Nov. 15, 1988

[30] Foreign Application Priority Data

Nov. 19, 1987 [JP] Japan .................................. 292927

[51] Int. Cl.$^4$ .................. B44C 1/22; C03C 15/00; C03C 25/06; B08B 3/12
[52] U.S. Cl. .................................. 156/635; 134/1; 134/30; 134/102; 134/105; 156/643; 156/646; 156/651; 156/657; 156/662; 156/345
[58] Field of Search .............. 156/635, 643, 646, 651, 156/657, 662, 345; 134/1, 30, 102, 105

[56] References Cited

U.S. PATENT DOCUMENTS

| | | | |
|---|---|---|---|
| 4,149,905 | 4/1979 | Levinstein et al. | 148/1.5 |
| 4,260,649 | 4/1981 | Dension et al. | 156/635 X |
| 4,693,779 | 9/1987 | Okuhira et al. | 156/345 X |
| 4,718,974 | 1/1988 | Minaee | 156/643 |
| 4,731,158 | 3/1988 | Brannon | 156/643 |

FOREIGN PATENT DOCUMENTS 227839  7/1987  European Pat. Off. .
246802 11/1987  European Pat. Off. .
3516611 11/1987 Fed. Rep. of Germany .

OTHER PUBLICATIONS

IBM Technical Disclosure Bulletin, vol. 27, No. 7B, Dec./1984.
Journal of the Electrochemical Society, vol. 134, No. 8A, Aug. 87.
Journal of Vacuum Science & Technology/A vol. 4, No. 3, May/June 1986.
VLSI Technology, p. 149 (Oxidation).

Primary Examiner—William A. Powell
Attorney, Agent, or Firm—Wenderoth, Lind & Ponack

[57] ABSTRACT

For cleaning substrates in a cleaning device, a reaction furnace of the cleaning device in which a substrate has been installed is evacuated and then supplied with a reducing gas, and a natural oxide film on the substrate is removed by heating it in an atmosphere of reducing gas, the reaction furnace is then is evacuated and a reactive gas is introduced into the reaction furnace, and contaminants on the substrate are removed by etching the substrate in the reactive gas that has been chemically activated by UV radiation.

15 Claims, 2 Drawing Sheets

METHOD AND DEVICE FOR CLEANING SUBSTRATES

BACKGROUND OF THE INVENTION

This invention concerns a substrate cleaning method and device, and in particular, a substrate cleaning method and device which is suitable for cleaning a semiconductor substrate (wafer), and in particular a silicon substrate, when an oxide film is formed.

In silicon integrated circuits formed by modern techniques, and in particular in MOS (Metal Oxide Semiconductor) integrated circuits, an extremely thin oxide film is used as a gate insulating film. In sub-micron MOS devices with a gate length of 1.0 $\mu$m or less, the film thickness used may for example be 100 Å or less. The objective of reducing the film thickness is to realize improved gain.

With oxide films, for example those used as gate insulating films in MOS devices such as those described above, improvement of electrical characteristics depends very much on ensuring that carbon or other contaminants are not contained in the oxide film when it is formed. To obtain a clean, high quality oxide film without contaminants, pre-oxidation cleaning is widely used as disclosed in, for example, Reference 1: "VLSI Technology" (edited by S. M. Sze, translated into Japanese by Yoshiyuki Takeishi et al, and published by Soken Shuppan)—p. 156.

In the most widely used substrate pre-oxidation cleaning method, carbon, organic and inorganic substances and heavy metal contaminants were removed from the substrate by using chemical reagents such as a mixture of hydrogen peroxide-water-hydrochloric acid solution ($H_2O_2O$-HCl), after which the substrate was washed with pure water. With $H_2O_2H_2O$-HCl, for example, soluble metal ion complexes are formed, and readhesion of the contaminants to the substrate is thereby prevented.

To form the oxide film after the substrate has been cleaned, it is placed in a reaction furnace. In the furnace, an oxide film is formed on the substrate surface by thermal oxidation. The substrate is usually heated at a relatively low temperature, e.g., below 800° C. for long periods of 30–60 min.

In the conventional cleaning method described above, however, the following problems arose.

(1) Although contaminant particles in the chemical reagents or pure water used to clean the substrate are removed as far as possible, they cannot in practice by removed completely. Even if these substances are used for cleaning, therefore, particulate contaminants in these reagents or water stick to the substrate. (2) Even if contaminants are removed, the oxygen in the atmosphere combines chemically with the substrate at room temperature to form a natural oxide film on the substrate surface.

If for example a gate insulating film is formed on the substrate when contaminants have not been completely removed and a natural oxide film is present, it is difficult to improve the electrical characteristics of the MOS device.

SUMMARY OF THE INVENTION

An object of the present invention is to provide a substrate cleaning method and device which resolve the above problems, and remove contaminants and the natural oxide film from the substrate.

In order to achieve the above objectives, the substrate cleaning method in the first aspect of the invention is characterized by comprising the step of evacuating and introducing a reducing gas into a reaction furnace of a substrate cleaning device wherein a substrate has been installed, the step of removing a natural oxide film on said substrate by heating it in an atmosphere of reducing gas, the step of evacuating and introducing a reactive gas into said reaction furnace, and the step of removing contaminants in said substrate by etching said substrate in a reactive gas that has been chemically activated by UV (ultraviolet) radiation.

In implementing this method according to the invention, it is desirable that contaminants are removed from the substrate while heating it.

In implementing this method according to the invention, it is also desirable that the removal of the natural oxide film from the substrate and the removal of the contaminants from the substrate are carried out while the reaction furnace is kept evacuated.

A substrate cleaning device according to the second aspect of the invention comprises a reaction furnace in which the substrate is installed, an evacuating means for evacuating the furnace, a gas supply means which can supply the furnace with at least a reducing gas to remove the natural oxide film from said substrate and a reactive gas to remove contaminants from said substrate, a heating means to heat said substrate in a reducing gas atmosphere supplied to said furnace,and a UV irradiation means to chemically activate said reactive gas.

In implementing the apparatus according to the invention, it is desirable that the heating means is an IR (infrared) lamp, the UV irradiation means is a UV lamp, and the heating means and the UV irradiation means are installed outside the reaction furnace such the IR and UV radiation can penetrate it.

In the substrate cleaning method according to the invention described above, the interior of the reaction furnace with a substrate installed is first cleaned by placing the furnace under vacuum, after which reducing gas is introduced. The substrate is then heated in a reducing gas atmosphere. The natural oxide film formed on the substrate surface is thereby reduced, and can thus be removed.

In the method according to the invention, after cleaning the interior of the reaction furnace with a substrate installed by placing it under vacuum, a reactive gas is introduced. The reactive gas is chemically activated by UV irradiation either before or after it is introduced. The activated gas therefore etches the substrate surface, and contaminants on the substrate are thereby removed.

It is desirable that the removal of natural oxide film (reduction of oxide film) and/or the removal of contaminants on the substrate (etching of substrate surface) take place while the furnace is kept evacuated. With the furnace being kept evacuated, the reaction products formed when the oxide film is reduced and the surface is etched can be discharged outside the furnace, and the cleanliness of the furnace can thus be improved.

In the apparatus according to the invention, there are provided an evacuating the means to evacuate gas from a reaction furnace, a gas supply means to supply at least a reducing gas and a reactive gas to the reaction furnace, a heating means to heat substrates in a reducing gas atmosphere, and a UV irradiation means to chemically activate the reactive gas.

With the use of the substrate cleaning device of the above structure, the reducing gas is used to reduce the natural oxide film and the reactive gas is used to etch the surface of the substrate, so that the cleanliness of the substrate is improved.

DETAILED DESCRIPTION OF THE EMBODIMENTS

Figure 1:
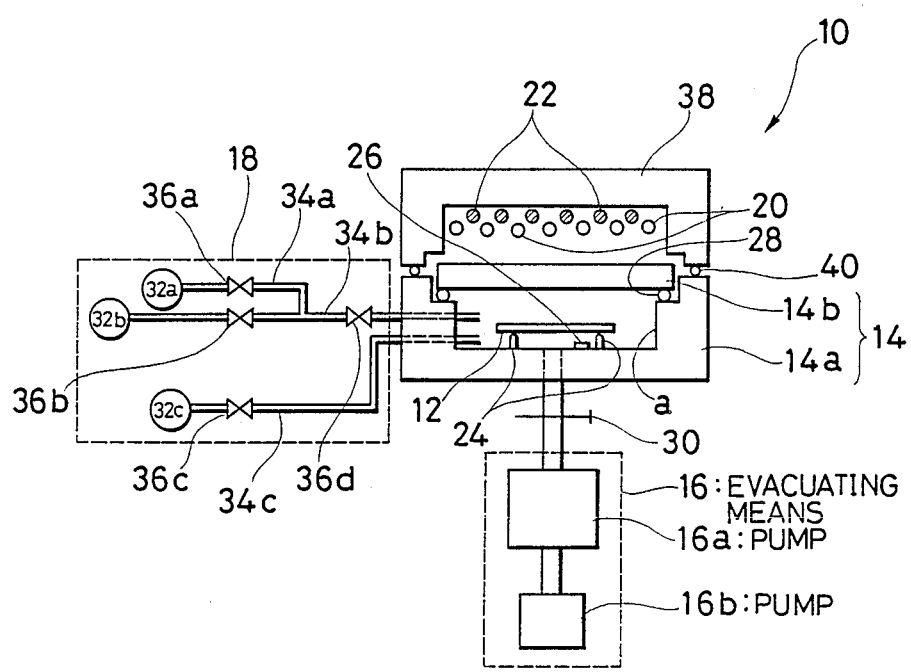
FIG. 1 is a diagram for explaining an embodiment of the invention.

Emobdiments of the invention wil now be described with reference to drawings. It should be noted that the drawings are only schematic diagrams intended to convey an understanding of the invention, and therefore, the dimensions, configurations and arrangement of each component in the assembly are not limited to the examples in the drawings.

Further, in the following explanation, specific materials and numerical conditions are quoted in order to convey a better understanding of the invention. It should however by understood that these materials and conditions are only examples, and may therefore by modified as desired.

FIG. 1 shows a cleaning device of a first embodiment of the invention. It is a model representation of the first embodiment of the invention, showing the substrate to be cleaned installed in the furnace.

After a cleaning device according to the first embodiment is described, the method according to the invention will thereafter be described.

In FIG. 1, the substrate cleaning device is denoted by reference numeral 10. The substrate cleaning device 10 of this embodiment comprises a reaction furnace 14 with a substrate (for example a silicon substrate) 12 installed therein, an evacuating means 16 to evacuate the furnace 14, a gas supply means 18 to supply at least a reducing gas and a reactive gas to furnace 14, a heating means 20 to heat the substrate 12 in a reducing gas atmosphere supplied to the furnace 14, and a UV irradiation means 22 to chemically activate the reactive gas.

The reaction furnace (chamber) 14 comprises a main body 14a and a lid 14b. In a sunken part a of the main body 14a, there are provided supporting members 24 for fixing a sample, and an optical pyrometer 26 (referred to hereafter simply as pyrometer) for measuring the surface temperature of the sample, for example substrate 12, which is placed on the supporting members. The lid 14b is fitted to the main body 14a so that it makes a tight fit, and so that it can be freely attached and removed. In the example shown in the figure, a sealtight joint 28, for example rubber packing, is provided between the main body 14a and lid 14b so that when gas is withdrawn from the furnace, an airtight seal is formed. The main body 14a may for example be made of stainless steel, while the lid 14b and supporting members 24 may be made of quartz.

The evacuating means 16 comprises a turbo-molecular pump 16a and rotary pump 16b. The rotary pump 16b is connected to the turbo-molecular pump 16a, and the turbo-molecular pump 16a is connected to the interior of the furnace 14 via a pressure regulating valve 30.

The gas supply means 18 comprises a reducing gas supply 32a and a reactive gas supply 32b, and an inert gas supply 32c is also provided. The reactive gas supply 32b is connected to the interior of the furnace 14 via a gas duct 34b, and gas duct 34b is provided with valves 36b and 36d. A reducing gas supply 32a is connected via a gas duct 34a to the gas duct 34b between the valves 36b and 36d. The gas duct 34a is provided with a valve 36a. In addition, the nitrogen supply 32c is connected to the interior of the furnace 14 via a gas duct 34c. The objective of valves 36a, 36b, 36c and 36d is to open and close the gas ducts.

The natural oxide film formed on substrate 12 is removed by a reducing gas, for example hydrogen ($H_2$), supplied from the gas supply 32a to the interior of the furnace 14. Inorganic and organic contaminants adhering to the substrate 12 are removed by a reactive gas, for example chlorine ($Cl_2$), supplied from the gas supply 32b to the interior of the furnace 14. Further, formation of natural oxide film on substrate 12 in in furnace 14 is prevented by an inert gas, for example nitrogen ($N_2$), supplied from the gas supply 32c to the interior of the furnace 14.

The heating means 20 may, for example, be formed of an IR lamp, and the UV irradiation means may, for example, be formed of a UV lamp. For the IR lamp, a tungsten halogen lamp, and for the UV lamp, a mercury lamp, are used. It is preferable that the heating means 20 and UV irradiation means 22 are installed outside the furnace 14 to prevent damage to the lamps when the furnace is evacuated.

The IR and UV radiation from the heating means 20 and the UV irradiation means 22 are made to penetrate the furnace 14 from outside it, and therefore part of the furnace 14 is made of a material transparent to IR radiation and/or UV radiation. The lid 14b, for example, is made of quartz, and an arrangement is adopted whereby the IR ray and UV ray penetrate the furnace 14 via the lid 14b.

A support 38 for the heating means 20 and the UV irradiation means 22 is installed on top of the furnace 14 such that it may be freely attached and removed. In this embodiment, the heating means 20 and the UV irradiation means 22 are installed on the support 38 opposite to the lid 14b. In this embodiment the heating means 20 and UV irradiation means 22 are provided in several, for example two, stages, and the number of lamps per unit surface area is thereby increased. In addition, the heating means 20 and the UV irradiation means 22 are arranged in alternate fashion such that IR and UV radiation enter the furnace 14 almost uniformly. The support 38 may for example be made of stainless steel.

A heater, for example, may be used as the heating means 20 instead of an IR lamp. In this case, the heater is installed inside the furnace 14, and the substrate 12 is heated by the heater.

Further, it is not absolutely necessary to install an inert gas supply 36c in the gas supply means 18.

An embodiment of the cleaning method in the invention will now be described with reference to FIG. 1. This embodiment will be described in connection with a case where the substrate is cleaned using the device embodying the invention.

As the substrate 12, a silicon substrate is first taken, and subjected to a so-called "pre-oxidation cleaning" by chemical reagents and pure water as in the prior art. The pre-oxidation cleaning may however be omitted.

Next, the substrate 12 is arranged on the supporting members 24, and the lid 14b is attached to the main body 14a. This completes the installation of the substrate 12 in the furnace 14.

In this embodiment, in order to prevent a natural oxide film from forming on the substrate 12 in the furnace 14, an inert gas such as nitrogen is introduced before the substrate 12 is installed. At that time, the valve 36c is opened to introduce only the inert gas. When this inert gas is introduced, the other valves 36a, 36b, 36]d d and 30 are closed, so no reducing gas and reactive gas are as yet introduced.

The valve 36c is then closed to stop the supply of the invert gas, and the evacuating means 16 is operated to evacuate the furnace 14 with the substrate 12 installed. The evacuation is performed for removing vapor and dust particles from the furnace 14 and by gradually opening the pressure regulating valve 30 while operating the turbo-molecular pump 16a and the rotary pump 16b. To improve the degree of cleanliness of the furnace 14, it is desirable that a high vacuum of less than $1 \times 10^{-6}$ Torr is produced inside it.

After the furnace 14 has been evacuated, the valves 36a and 36d are opened, and a reducing gas such as hydrogen is introduced.

In this embodiment, in order that reaction products formed when the natural oxide film on the substrate 12 is removed may be discharged outside the furnace 14, the furnace containing the reducing gas is arranged to be kept evacuated. For this purpose, while the reducing gas is introduced, the pressure regulating valve 30 is manipulated, and at the same time the flowrate of reducing gas is adjusted such that the reduced the vacuum is maintained at about $1 \times 10^{-2}$ Torr. As in the usual procedure, the gas flowrate may be adjusted by means of a flowmeter or similar gas flowrate adjusting device (not shown in the figure).

Next, the substrate 12 is heated in the reducing gas atmosphere to remove the natural oxide film. If an IR lamp is used as the heating means 20, the radiation from the IR lamp is made to impinge on the substrate 12 through the lid 14b, and the substrate is thereby heated. Using a pyrometer 26 to measure the surface temperature of the substrate 12, its surface temperature is gradually increased at a temperature programming rate of 100° C./sec until it reaches approximately 1000° C., and this surface temperature of approximately 1000° C. is held for about 10-30 sec. By heating the substrate 12 in the reducing gas atmosphere, the natural oxide film on the substrate 12 is reduced, and is thereby removed. As the furnace 14 is kept supplied with the reducing gas from the gas supplying means 18 and kept evacuated by the evacuating means 16, the reaction products of this reduction are discharged outside the furnace 12. Soiling of the furnace 14 and the substrate 12 by the reaction products is thus prevented.

After the natural oxide film has been removed, the heating of substrate 12 by the heating means 20 is stopped, and the substrate 12 is cooled until its surface temperature reaches the room temperature (approximately 25° C.). This cooling step may however be omitted.

The valves 36a, 36d are closed and the supply of the reducing gas is stopped, then the evacuating means 16 is operated and the furnace 14 is evacuated. To improve the degree of cleanliness in the furnace, it is preferable that in this evacuation a high vacuum of $1 \times 10^{-6}$ Torr or less is produced.

After the evacuation, the valves 36b and 36d are opened to introduce a reactive gas, for example chlorine, into the furnace 14.

In this embodiment, in order that reaction products that are formed when the contaminants in the substrate 12 are removed may be discharged outside the furnace 14, the furnace 14 containing the reactive gas is kept supplied with the reactive gas and kept evacuated. For this purpose, the pressure regulating valve 30 is manipulated while adjusting the flowrate of the reducing gas such that the vacuum reaches about $1 \times 10^{-2}$ Torr.

Next, the substrate 12 is etched by the reactive gas that has been chemically activated by UV radiation, and contaminants such as inorganic substances and heavy metals adhering to the substrate 12 are thereby removed. The chemical activation of the reactive gas is achieved by turning on a UV lamp as a source of UV radiation, and causing the radiation from the lamp to impinge on the reactive gas in the furnace 14 through the lid 14b.

The chemically activated reactive gas combines chemically with contaminants on the substrate 12 and with the substrate itself to form volatile reaction products. The substrate is thereby etched, and the contaminants on the substrate are thus eliminated. As the furnace is kept evacuated, these volatile reaction products are discharged outside the furnace. Soiling of the furnace 14 and substrate 12 by the reaction products is thus prevented.

In this embodiment, to improve the reactivity of the reactive gas with the contaminants on the substrate 12 and with the substrate 12, the contaminants are eliminated while heating the substrate 12. The contaminants may for example be removed by heating the substrate 12 with the heating means 20 such that a surface temperature of approximately 300° C. is maintained, and etching it for approximately 20 sec.

After the contaminants have been removed, both the heating with the heating means 20 and UV irradiation with the UV irradiation means 22 are stopped. The substrate 12 is then cooled in this condition such that its surface temperature reaches the room temperature (25° C.).

Subsequently, the substrate 12 is maintained in an inert gas atmosphere to prevent formation of a natural oxide film on its cleaned surface.

For this purpose, the valves 36b, 36d are closed, the supply of the reactive gas is stopped, and the furnace 14 is evacuated until the vacuum reaches for example $1 \times 10^{-6}$ Torr. The pressure regulating valve 30 is then closed, and the operation of the evacuating means 16 is stopped. After this the valve 36c is opened, the inert gas is supplied to the furnace 14 and the substrate 12 is maintained in the inert gas in the furnace. This process of maintaining the substrate 12 in the inert gas may be carried out without cooling the substrate 12.

In this embodiment, contaminants are removed from the substrate 12 while heating it, and the etching time can thus be shortened.

Further, in this embodiment, removal of the natural oxide film and contaminants takes place when the furnace 14 is kept evacuated. Soiling of the furnace 14 and the substrate 12 by the reaction products is thus prevented, and the cleanliness of the substrate 12 can effectively be improved.

In the above embodiment, it is not absolutely necessary to maintain the substrate 12 in an inert gas atmosphere when the substrate 12 is placed in the reaction furnace 14 or after the substrate 12 is cleaned. Further, it is not absolutely necessary to heat it while removing contaminants, nor to have the furnace at a reduced pressure or to keep evacuating the furnace when the natural oxide film and contaminants are removed.

Figure 2:
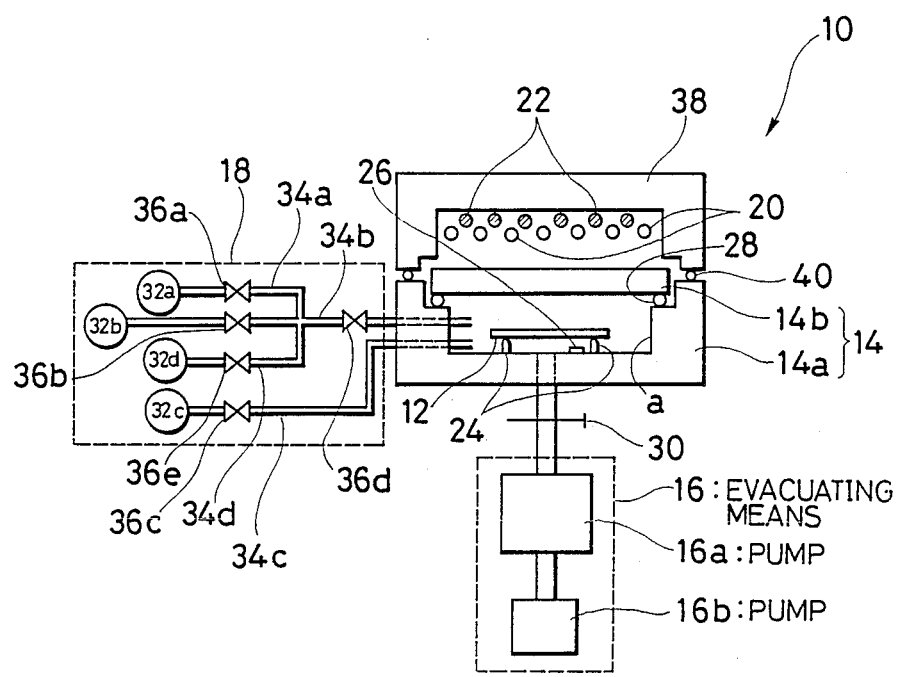
FIG. 2 is a diagram for explaining another embodiment of the invention.

FIG. 2 illustrates a second embodiment of the apparatus according to the invention. In FIG. 2, structural components corresponding to those shown in FIG. 1 have been given the same numbers, and their detailed explanation has been omitted.

In the following description, in order to convey a better understanding, reference has been made to specific materials and numerical conditions, but it should be understood that these materials and conditions are only examples and may be modified as desired.

The structure of the second embodiment is the same as that in the first embodiment described above excepting that the gas supply means 18 is different.

In this embodiment, the gas supply source 18, as shown in FIG. 2, comprises an oxidizing gas source 36a in addition to the reducing gas source 32a, the reactive gas source 32b, and the inert gas source 32c. The oxidizing gas source 36a is connected to the duct 34b between the valves 36b and 36d via a duct 34d. The duct 34d is provided with a valve 36e, and therefore the supply or interruption of oxidizing gas, for example oxygen ($O_2$) to the furnace 14, may be controlled by manipulating the valves 36e and 36d.

Using the device of this embodiment, an oxide film can be formed on the surface of a very clean substrate 12 from which the natural oxide film and contaminants have been removed. Further if nitrogen is used as the inert gas, the nitrogen suppied to furnace 14 may be used as a nitrifying gas, and the oxide film formed on the surface of substrate 12 can also be nitrified.

The formation of an oxide film on the substrate and its nitrification using the device in the second embodiment of the invention mentioned above will be described.

Firstly the substrate 12, for example a silicon substrate, is given a pre-oxidation cleaning as in the prior art, and is then installed in the furnace 14. To prevent formation of a natural oxide film on the substrate 12, an inert gas is introduced into the furnace 14 before the installation of the substrate. At this point, no reducing gas or reactive gas has yet been introduced.

The supply of the inert gas is then stopped, and the furnace 14 is evacuated with the evacuating means 16. In this evacuation, it is preferable that a high vacuum of $1 \times 10^{-6}$ Torr or less is produced.

After the evacuation, a reducing gas is introduced into the furnace 14. In this process, the furnace containing the reducing gas is arranged to be at a reduced pressure of approximately $1 \times 10^2$ Torr.

Next, the substrate 12 is heated in an atmosphere of a reducing gas to remove the natural oxide film. Its surface temperature is gradually increased at a temperature programming rate of 100° C./sec until it reaches approximately 1000° C., and this surface temperature of approximately 1000° C. is held for about 10–30 sec. By heating the substrate 12 in the reducing gas atmosphere, the natural oxide film on the substrate is reduced, and is thereby removed. As the furnace 14 is kept evacuated, the reaction products of this reduction are discharged outside the furnace 14.

After the natural oxide film has been removed, the heating of substrate 12 by the heating means 20 is stopped, and the substrate 12 is cooled until its surface temperature reaches the room temperature (approximately 25° C.). This cooling step may however by omitted.

The supply of reducing gas is then stopped, the evacuating means 16 is operated and the furnace 14 is evacuated. In this evacuation, it is preferable that a high vacuum of $1 \times 10^{-6}$ Torr or less is produced.

After the evacuation, a reactive gas is introduced into the furnace. In this process, it is desirable that the furnace containing reactive gas is arranged to be at a reduced pressure of $1 \times 10^{-2}$ Torr.

Next, the substrate 12 is etched by a reactive gas that has been chemically activated by UV radiation from the UV irradiation means 22, and contaminants adhering to the substrate are thereby removed. The reactive gas is chemically activated by the UV radiation from the UV irradiation means 22. Owing to the reactive gas that has been chemically activated, the substrate 12 is etched and the contaminants on the substrate 12 is removed from the substrate 12. As the furnace 14 is kept evacuated, the reaction products of this etching are discharged outside the furnace. It is preferable that the removal of contaminants in the substrate 12 is carried out while heating it. If the substrate is heated by the heating means 20 so as to maintain a surface temperature of approximately 300° C., and if it is etched for approximately 30 sec, the removal of contaminants is satisfactory in practice.

When the contaminants have been removed, both the heating with the heating means 20 and UV irradiation with the UV irradiation means 22 are stopped. The substrate 12 is then cooled in this condition such that its surface temperature reaches the room temperature (25° C.). This cooling of the substrate 12 is carried out so that the thickness of the oxide film formed in the subsequent processing can be accurately controlled.

These processes are the same as those in the embodiment of the invention described above.

After the etching and the cooling of the substrate 12, the valves 36b and 36d are closed, the pressure regulating valve 30 is gradually opened, and the furnace 14 is evacuated. In this evacuation, it is preferable that a high vacuum of $1 \times 10^{-6}$Torr or less is produced so as to improve the degree of cleanliness of the furnace.

Following the evacuation, the valves 36e and 36d are opened, and an oxidizing gas such as oxygen is supplied to the furnace. In this process, in order that the reaction products of the oxidation may be discharged outside the furnace, it is desirable that the furnace containing oxygen is arranged to be kept evacuated to maintain a reduced pressure, for example approximately $1 \times 10^{-2}$ Torr.

The substrate 12 is then heated in the oxygen atmosphere in the furnace 14 by the heating means 20 so as to form an oxide film on the substrate surface. Using the pyrometer 26 to monitor the surface temperature of the substrate, the substrate 12 is heated at a temperature programming rate of 100° C./sec up to approximately 1100° C., and its surface temperature is mantained at about 1100° C. for approximately 20 sec. Under these conditions, an oxide film of about 100 Å is formed on the substrate. The thickness of the oxide film may be controlled by adjusting for example the oxidation temperature, the oxidation time and the oxygen flowrate.

When the desired thickness of the oxide film has been obtained, heating of the substrate 12 by the heating means 20 is stopped. The flow of oxygen is stopped at the same time as the heating or afterwards, and the oxygen in the furnace is then replaced by an inert gas.

Growth of oxide film beyond the desired thickness is thereby prevented.

For this purpose, the valves 36e and 36d are closed to stop the supply of oxygen when or after heating of the substrate is stopped, the pressure regulating valve 30 is opened, and the furnace 14 is evacuated. In this evacuation, it is desirable that a high vacuum of $1 \times 10^{-6}$ Torr or less is produced. After the evacuation, the valve 30 is closed and the operation of the evacuating means 16 is stopped, then the valve 36c is opened and the inert gas is suppled to the furnace. In this way, the substrate 12 is maintained in the furnace 14 in an inert gas atmosphere.

When the surface temperature of the substrate 12 has reached the room temperature (approximately 25° C.), it is brought out into the atmosphere and subsequent processing may then be carried out.

In this embodiment, as is clear from the above description, an oxide film can be formed on a very clean substrate 12 from which the natural oxide film and contaminants have been removed.

As explained above, the furnace 14 is evacuated to a high vacuum and then arranged to be kept evacuated in order to improve its degree of cleanliness. At present it is technically impossible to remove contaminants from the furnace completely, and a very small quantity of contaminants therefore remains in it. In this embodiment, however, the oxide film is formed by rapid thermal oxidation, and so the probability that contaminants remaining in the furnace will soil the oxide film when it forms (grows) can be extremely reduced. This gives a cleaner oxide film of a higher quality than in the prior art, and a highly reliable oxide film for use as a gate in sub-micron MOS devices can therefore be obtained. In this embodiment, a gate oxide film of sub-micron order may be obtained by heating the substrate 12 for a period of, for example, 10-30 sec. In the prior art, thermal oxidation was carried out for long periods, and there was a very high probability of contaminants in the furnace soiling the oxide film. In this embodiment, however, heating is carried out for only a short period, and the probability of soiling the film is thus very much less.

Processing for nitrifying the oxide film formed on the substrate 12 may, for example, be carried out as follows.

An oxide film of a desired thickness is grown on the substrate 12 by the procedure described above, the supply of oxygen is stopped, and the furnace 14 is evacuated. In this process, it is preferable that the furnace is evacuated to a pressure of $1 \times 10^{-6}$ Torr or less.

After the evacuation, nitrogen is introduced into the furnace. It is preferable that the furnace containing nitrogen is arranged to be kept evacuated to maintain a pressure of approximately $1 \times 10^{-2}$ Torr.

Following the introduction of nitrogen, the substrate 12 is heated in the nitrogen atmosphere in the furnace 14, which nitrifies the oxide film on the substrate. The nitrogen gas used for this nitrification may be the same as that used as the inert gas mentioned above.

The invention is not limited to the above embodiment, and therefore the materials, composition, form and arrangement of each component or the numerical conditions may be modified as desired.

In the embodiments described, the pressure of the furnace 14 when it is filled with the reducing gas is in the order of $10^{-2}$ Torr. But this pressure can be of any value from about $10^{-2}$ Torr to the atmospheric pressure.

In the embodiments described, the pressure of the furnace 14 when it is filled with the reactive gas is in the order of $10^{-2}$ Torr. But this pressure can be of any value from about $10^{-2}$ Torr to the atmospheric pressure.

In the embodiments described, the pressure of the furnace 14 when it is evacuated prior to the reduction is $10^{-6}$ Torr. Even higher vacuum (lower pressure) is more desirable from the viewpoint of removing contaminants. But there is a limitation from the equipment used.

In the embodiments described, the pressure of the furnace 14 when it is evacuated prior to the etching is $10^{-6}$ Torr. Even higher vacuum (lower pressure) is more desirable from the viewpoint of removing contaminants. But there is a limitation from the equipment used.

In the embodiments described, the temperature during reduction is about 1000° C. But it can be higher. There is an upper limit at about 1300° C. at which the substrate melts.

In the embodiments described, the temperature during etching is about 300° C. But it can be of any value from the the room temperature (25° C.) to about 300° C.

As is clear from the above description, according to the cleaning method of the invention, the reaction furnace is first cleaned by evacuating it with the substrate installed, a reducing gas is introduced, and the substrate is then heated in the furnace in a reducing gas atmosphere. The natural oxide film formed on the substrate surface is reduced by this heating in the reducing gas, and can therefore be removed.

After cleaning by evacuation the reaction furnace with the substrate installed, a reactive gas is introduced. The or after it is introduced into the furnace. The substrate surface is etched by means of the activated gas, and contaminants can therefore be removed form it.

Since both the natural oxide film and contaminants can be removed from the substrate, the substrate surface can be better cleaned than in the prior art.

Also, the cleaning device according to the invention can be used to remove the natural oxide film on the substrate (reduction of natural oxide film) and eliminate contaminants from the substrate (etching of substrate surface), and the substrate surface can therefore be better cleaned than in the prior art.

Further, the invention may be used to oxidize the substrate, nitrify the oxide film on the substrate, or carry out a variety of other surface treatments.

What is claimed is:

1. A method of cleaning substrates comprising the steps of:
    (a) evacuating a reaction furnace of a substrate cleaning device in which a substrate has been installed;
    (b) introducing a reducing gas into said reaction furnace of a substrate cleaning device;
    (c) removing a natural oxide film on said substrate by heating it in an atmosphere of reducing gas;
    (d) evacuating said reaction furnace;
    (e) introducing a reactive gas into said reaction furnace; and
    (f) removing contaminants on said substrate by etching said substrate in said reactive gas that has been chemically activated by UV radiation.

2. A method of cleaning a substrate as set forth in claim 1, wherein during the removal of the natural oxide film at said step (c) said substrate is heated.

3. A method of cleaning a substrate as set forth in claim 2, wherein during the removal of the natural oxide film at said step (c) said substrate is heated to a temperature of not lower than about 1000° C.

4. A method of cleaning a substrate as set forth in claim 1, wherein the removal of the natural oxide film from said substrate is carried out while said reaction furnace is supplied with the reducing gas and is evacuated.

5. A method of cleaning a substrate as set forth in claim 4, wherein the removal of the natural oxide film from said substrate is performed while said reaction furnace is evacuated to maintain a pressure of not lower than about $10^{-2}$ Torr.

6. A method of cleaning a substrate as set forth in claim 1, wherein during the removal of the contaminants at said step (f) said substrate is heated.

7. A method of cleaning a substrate as set forth in claim 6, wherein during the removal of the contaminants at said step (f) said substrate is heated to a temperature of not higher than about 300° C.

8. A method of cleaning a substrate as set forth in claim 1, wherein the removal of the contaminants from said substrate is carried out while said reaction furnace is supplied with the reactive gas and is evacuated.

9. A method of cleaning a substrate as set forth in claim 8, wherein the removal of the contaminants from said substrate is performed while said reaction furnace is evacuated to maintain pressure of not lower than about $10^{-2}$ Torr.

10. A method of cleaning a substrate as set forth in claim 1, further comprising the step of
   (g) filling the reaction furnace with an inert gas prior to the installation of said substrate for said step (a).

11. A method of cleaning a substrate as set forth in claim 1, further comprising the step of
   (h) cleaning the substrate using a chemical agent and pure water prior to the installation of the substrate for said step (a).

12. A method of cleaning a substrate as set forth in claim 1, wherein the evacuation at said step (a) is performed to create a vacuum of $10^{-6}$ Torr or less.

13. A method of cleaning a substrate as set forth in claim 1, wherein the evacuation at said step (d) is performed to create a vacuum of $10^{-6}$ Torr or less.

14. A substrate cleaning device comprising:
   a reaction furnace in which a substrate is installed;
   an evacuating means for evacuating the reaction furnace;
   a gas supply means which can supply the furnace with at least a reducing gas to remove a natural oxide film from said substrate and a reactive gas to remove contaminants from said substrate;
   a heating means to heat said substrate in a reducing gas atmosphere supplied to said furnace; and
   a UV irradiation means to chemically activate said reactive gas.

15. A substrate cleaning device as set forth in claim 14 wherein
   said heating means comprises an infra-red lamp, said UV irradiation means comprises an ultra-violet lamp; and
   said heating means and UV irradiation installed outside the furnace so that IR and UV radiation can penetrate into the furnace from outside.

* * * * *